United States Patent [19]

Tamada et al.

[11] Patent Number: 5,750,313
[45] Date of Patent: May 12, 1998

[54] PHOTOSENSITIVE RESIN COMPOSITION AND PROCESS FOR PRODUCING THE SAME

[75] Inventors: Hiroshi Tamada; Shigetora Kashio; Tamio Adachi, all of Okazaki, Japan

[73] Assignee: Toray Industries, Inc., Japan

[21] Appl. No.: 782,716

[22] Filed: Jan. 13, 1997

Related U.S. Application Data

[63] Continuation of Ser. No. 394,154, Feb. 24, 1995, abandoned.

[30] Foreign Application Priority Data

Feb. 28, 1994 [JP] Japan ................... 6-030424

[51] Int. Cl.⁶ .................. G03F 7/028; G03F 7/032
[52] U.S. Cl. ................. 430/280.1; 430/909; 522/101
[58] Field of Search ................. 430/280.1, 909; 522/101

[56] References Cited

U.S. PATENT DOCUMENTS

| | | | |
|---|---|---|---|
| 2,902,365 | 9/1959 | Martin | 430/909 X |
| 3,899,338 | 8/1975 | Lewis | 430/909 X |
| 4,092,443 | 5/1978 | Green | 427/53 |
| 4,340,686 | 7/1982 | Foss | 430/909 X |
| 4,517,277 | 5/1985 | Lynch et al. | 430/909 X |
| 4,600,746 | 7/1986 | Schmukler et al. | 525/57 |
| 4,606,993 | 8/1986 | Fujikawa et al. | 430/909 X |
| 5,364,736 | 11/1994 | Eramo, Jr. et al. | 430/280 |
| 5,369,168 | 11/1994 | Famili et al. | 525/57 |

FOREIGN PATENT DOCUMENTS

| | | | |
|---|---|---|---|
| 49-4738 | 1/1974 | Japan | 430/280 |
| 4-283749 | 10/1992 | Japan | 430/285.1 |
| A-04 283 749 | 10/1992 | Japan . | |

OTHER PUBLICATIONS

PTO 96–2384, English Translation of Japan Kokai 04–283749 (Kashio et al) made by U.S. Patent and Trademark Office Mar. 1996(Schreiber Translation, Inc.)

Primary Examiner—Cynthia Hamilton
Attorney, Agent, or Firm—Austin R. Miller

[57] ABSTRACT

Disclosed are a photosensitive resin composition essentially comprising 100 parts by weight of modified polyvinyl alcohol comprising a structural units of formulae (I), (II) and (III):

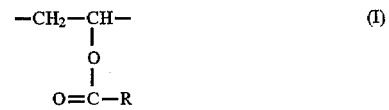

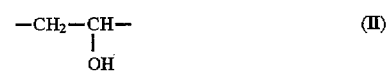

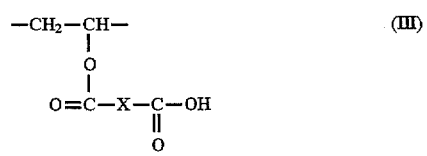

wherein R represents a hydrocarbon group having 1 to 20 carbon atoms; X represents an aliphatic, alicyclic or aromatic divalent hydrocarbon group having 1 to 20 carbon atoms or a divalent group having at least one carboxyl group in the molecule thereof, the proportion of the structural unit of formula (I) being from 1 to 40 mol %, the total proportion of the structural units of formulae (II) and (III) being from 60 to 99 mol %, and the carboxyl equivalent attributed to the structural unit of formula (III) being from 0.3 to 5 mol/kg, (B) from 0.1 to 10 parts by weight of an unsaturated epoxy compound, (C) from 20 to 200 parts by weight of a polymerizable unsaturated compound having an ethylenical double bond in the molecule thereof, and (D) from 0.1 to 10 parts by weight of a photopolymerization initiator. A photosensitive resin composition containing modified polyvinyl alcohol obtained by reacting partially saponified polyvinyl alcohol having a degree of saponification of 60 to 99 mol % and a number average degree of polymerization of 300 to 2,000 with a carboxylic acid anhydride in a molten state is also disclosed. Additionally, and a process for producing a photopolymerizable resin composition comprising reacting partially saponified polyvinyl alcohol having a degree of saponification of 60 to 99 mol % and a number average degree of polymerization of 300 to 2,000 with a carboxylic acid anhydride in a molten state to prepare (A-2) modified polyvinyl alcohol and mixing modified polyvinyl alcohol (A-2) with (C) a polymerizable unsaturated compound having an ethylenical double bond in the molecule thereof, and (D) a photopolymerization initiator is disclosed. The photosensitive resin compositions provide a printing plate material having high sensitivity and highly precise image reproducibility, from which material is obtained a printing plate whose relief has excellent toughness. The use of the modified polyvinyl alcohol obtained by a molten reaction makes it easy to prepare a solution of a photosensitive resin composition.

1 Claim, No Drawings

PHOTOSENSITIVE RESIN COMPOSITION AND PROCESS FOR PRODUCING THE SAME

This application is a continuation of application Ser. No. 08/394,154, filed Feb. 24, 1995 now abandoned.

BACKGROUND OF THE INVENTION

1. Field of the Invention

This invention relates to a photosensitive resin composition suitable for production of a printing material which exhibits high sensitivity, highly precise image reproducibility, and excellent developability with water to provide a printing plate with its relief having high toughness. More particularly, it relates to a photosensitive resin composition having the above-mentioned excellent properties, which is obtained by using a specific carboxyl-graft modified polyvinyl alcohol.

2. Description of the Prior Art

Presensitized plates (hereinafter referred to as PS plates) for relief printing, lithography and intaglio printing which comprise a metal or plastic substrate having provided thereon a layer of a photopolymerizable photosensitive resin composition (hereinafter referred to as a photosensitive layer) have taken the place of conventional metallic plates and been used in a variety of printing fields. With the recent diversification of the printing fields and an increasing demand for precision of print, a printing material having highly precise image reproducibility to provide fine relief has been demanded. Platemaking using a PS plate consists of an exposure process in which the photosensitive layer is contact exposed with active light, such as ultraviolet light, through a negative or positive original film composed of transparent areas and opaque areas to cause the photosensitive layer in the areas corresponding to the transparent areas of the original to photopolymerize and a development process in which the unpolymerized areas are removed by dissolving with an appropriate solvent to form a relief on the substrate. Such photopolymerizability of the photosensitive resin composition has been taken advantage of in various uses such as platemaking. In particular, resin compositions using polyvinyl alcohol (hereinafter abbreviated as PVA) as a base polymer have been proposed as a system developable with neutral water.

Photosensitive resin compositions using PVA as a base polymer are roughly divided into two systems. The first system comprises PVA combined with a photopolymerizable monomer having an ethylenically unsaturated bond so as to endow the composition photopolymerizability. Photosensitive resin compositions of this type are disclosed in Japanese Patent Laid-Open Nos. 39401/71, 30903/75, 87903/73, 27902/75, 124730/82, 212217/82, 172644/84, and 51833/85.

The second system comprises PVA having an unsaturated bond-containing compound introduced into the hydroxyl group thereof. Known examples of this type are disclosed in Japanese Patent Laid-Open Nos. 66151/73, 45087/75, 13890/79, 21736/83, 176303/84, 185332/84, and 60133/89.

In the case of the second system, since hydroxyl groups of PVA contributing to water-solubility are consumed in large proportion for introduction of unsaturated bonds, the resin has reduced water developability. On the other hand, although the first system provides a PS plate exhibiting satisfactory water developability, the relief formed is brittle.

Japanese Patent Laid-Open No. 283749/92 discloses a photosensitive resin composition comprising modified PVA prepared by reacting partially saponified PVA having a degree of saponification of 60 to 99 mol % and a degree of polymerization of 30 to 2000 with an acid anhydride to add a carboxyl group to the side chain, an unsaturated epoxy compound, a polymerizable unsaturated compound, and a photo-initiator. However, this composition still does not succeed in achieving such a high resolution as demanded recently.

In the above-mentioned technique, the reaction between partially saponified PVA and an acid anhydride is conducted with the partially saponified PVA swollen with a solvent. However, the modified PVA obtained by this method has poor solubility in water or other solvents and meets difficulty in preparing a solution of the photosensitive resin composition. Further, where the method disclosed for preparing the modified PVA is followed, it is difficult to set the reaction temperature above the boiling point of the solvent used so that the reaction rate is considerably low.

SUMMARY OF THE INVENTION

An object of the present invention is to provide a water-developable photosensitive resin composition which exhibits high sensitivity and highly precise image reproduction in platemaking and provides a printing plate having a tough relief.

Another object of the present invention is to provide a photosensitive resin composition which can be prepared with ease.

The present invention relates to a photosensitive resin composition essentially comprising:

(A-1) 100 parts by weight of modified PVA comprising a structural units of formulae (I), (II) and (III):

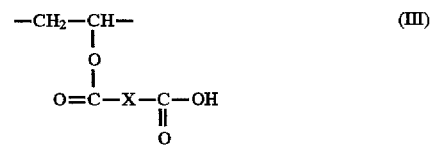

wherein R represents a hydrocarbon group having 1 to 20 carbon atoms; X represents an aliphatic, alicyclic or aromatic divalent hydrocarbon group having 1 to 20 carbon atoms or a divalent group having at least one carboxyl group in the molecule thereof, the proportion of the structural unit of formula (I) being from 1 to 40 mol %, the total proportion of the structural units of formulae (II) and (III) being from 60 to 99 mol %, and the carboxyl equivalent attributed to the structural unit of formula (III) being from 0.3 to 5 mol/kg, (B) from 0.1 to 10 parts by weight of an unsaturated epoxy compound, (C) from 20 to 200 parts by weight of a polymerizable unsaturated compound having an ethylenical double bond in the molecule thereof, and (D) from 0.1 to 10 parts by weight of a photopolymerization initiator.

The present invention further relates to a photosensitive resin composition containing (A-2) modified PVA obtained by reacting partially saponified PVA having a degree of saponification of 60 to 99 mol % and a number average degree of polymerization of 300 to 2,000 with a carboxylic acid anhydride in a molten state.

The present invention furthermore relates to a process for producing a photosensitive resin composition comprising reacting partially saponified PVA having a degree of saponification of 60 to 99 mol % and a number average degree of polymerization of 300 to 2,000 with a carboxylic acid anhydride in a molten state to prepare (A-2) modified PVA and mixing modified PVA (A-2) with (C) a polymerizable unsaturated compound having an ethylenical double bond in the molecule thereof, and (D) a photopolymerization initiator.

DESCRIPTION OF THE PREFERRED EMBODIMENTS

The modified PVA which can be used in the present invention comprises structural units of formulae (I), (II) and (III):

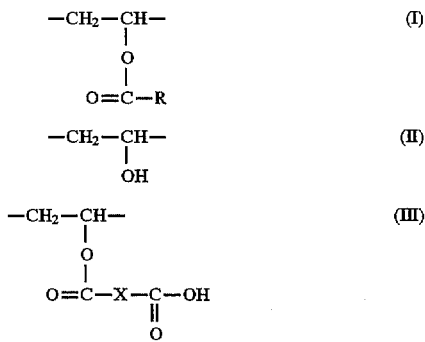

wherein R represents a hydrocarbon group having 1 to 20 carbon atoms; X represents an aliphatic, alicyclic or aromatic divalent hydrocarbon group having 1 to 20 carbon atoms or a divalent group having at least one carboxyl group in the molecule thereof.

The modified PVA can be obtained by reacting partially saponified PVA comprising structural units (I) and (II), which is derived by partial saponification of a carboxylic acid vinyl ester polymer (preferably polyvinyl acetate), with a carboxylic acid anhydride. By this reaction, the hydroxyl group of structural unit (II) and the carboxylic acid anhydride are reacted to form structural unit (III). In nature of a chemical reaction, the total proportion of structural units (II) and (III) in the modified PVA corresponds to the degree of saponification of the partially saponified PVA (before being reacted). The number average degree of polymerization of the resulting modified PVA theoretically agrees with the degree of polymerization of the partially saponified PVA before being reacted.

While any of general carboxylic acid anhydrides can be used without particular limitation, it is preferable to use an intramolecular anhydride derived from a carboxylic acid having two or more carboxyl groups. Examples of suitable carboxylic acid anhydrides are succinic anhydride, maleic anhydride, acetic anhydride, trimellitic anhydride, phthalic anhydride, pyromellitic anhydride, glutaric anhydride, hydrogenated phthalic anhydride, and naphthalenedicarboxylic anhydride. Preferred of them are succinic anhydride, maleic anhydride, trimellitic anhydride, phthalic anhydride, pyromellitic anhydride, glutaric anhydride, hydrogenated phthalic anhydride, and naphthalenedicarboxylic anhydride, with succinic anhydride, phthalic anhydride, and hydrogenated phthalic anhydride being still preferred. Succinic anhydride is the most preferred. These carboxylic acid anhydrides may be used either individually or as a combination of two or more thereof. In particular, carboxylic acid anhydrides containing two or more carboxyl groups per and no olefinic unsaturated bond per molecule are preferred.

In the partially saponified PVA, the higher the degree of saponification, the higher the proportion of structural unit (II). At the same time, the polymer gets more crystalline with the increase of structural unit (II) and, as a result, becomes much less water-soluble. So if the proportion of structural units (I) and (III) are properly adjusted so as to inhibit crystallization of structural unit (II), the water solubility of the polymer would markedly be improved. In particular, structurally bulky unit (III) largely hinders crystallization of structural unit (II), making a great contribution to the improvement of water solubility. Additionally, structural unit (III) also serves as a functional group for introducing a photopolymerizable group into the polymer.

The modified PVA according to the present invention comprises structural unit (I) in a proportion of from 1 to 40 mol %, preferably from 10 to 30 mol %, and structural units (II) and (III) in a total proportion of 60 to 99 mol %. If the proportion of structural unit (I) is less than 1 mol % or more than 40 mol %, the water solubility of the modified PVA is reduced.

In particular, modified PVA (A-1) characterized in that a carboxyl equivalent attributed to unit (III) ranges from 0.3 to 5 mol/kg can preferably be used in the present invention. The carboxyl equivalent of modified PVA (A-1) still preferably ranges from 0.3 to 2 mol/kg. If the carboxyl equivalent is less than 0.3 mol/kg, the precise image reproducibility of the resulting photosensitive resin composition and the toughness of the relief of the resulting printing plate would be reduced. If it exceeds 5 mol/kg, the water developability of the resulting photosensitive resin composition is seriously reduced. While not limiting, the number average degree of polymerization of modified PVA (A-1) is preferably in the range of from 300 to 2,000. If the number average degree of polymerization is less than 300, the photosensitive resin composition tends to have reduced relief toughness. If it exceeds 2000, the rate of water development of the photosensitive resin composition tends to be reduced.

Modified PVA (A-1) can be prepared by reacting partially saponified PVA having a degree of saponification of 60 to 99 mol % with a carboxylic acid anhydride. While the conditions for the preparation are arbitrary, a reaction in a molten state as hereinafter described is suitable for the following reason. If the reaction is carried out in the presence of a solvent as in the conventional method, it is difficult to introduce a carboxyl group at a high reaction rate so that a carboxylic acid anhydride remaining unreacted and its hydrolysate are liable to remain as impurities.

In the present invention, also useful as modified PVA is modified PVA (A-2) which is obtained by reacting partially saponified PVA having a degree of saponification of 60 to 99 mol % and a number average degree of polymerization of 300 to 2,000 with a carboxylic acid anhydride in a molten state. To conduct the reaction in a molten state makes it possible to achieve a higher reaction rate of the carboxylic acid anhydride than ever. In addition, the modified PVA obtained by this method is easily soluble in a solvent, thus making it easier to prepare a solution of a photosensitive resin composition.

The reaction system for the preparation of modified PVA (A-2) is preferably solvent-free.

The reaction temperature is not particularly limited. Where the reaction is performed in a molten state in the absence of any solvent, the reaction temperature is in the range in which either one of the partially saponified PVA and the carboxylic acid anhydride is melted and a sufficient reaction rate is assured, i.e., of from 100° to 400° C., preferably from 120° to 300° C., still preferably from 140° to 240° C.

The carboxylic acid anhydride is suitably charged in an amount of 0.001 to 20 parts by weight per 100 parts by weight of the partially saponified PVA. The lower limit of the amount of the carboxylic acid anhydride to be charged is 0.1 part, 1 part or 3 parts, each by weight, in an ascending order of preference. The upper limit in an ascending order of preference is 10 parts by weight or 5 parts by weight. If the amount of the carboxylic acid anhydride is less than 0.001 part by weight, satisfactory effects of modification will not be produced. If it exceeds 20 parts by weight, side reactions such as a crosslinking reaction in a molten state may exert adverse influences.

The apparatus for carrying out the reaction between the partially saponified PVA and a carboxylic acid anhydride are not particularly limited. For example, the reaction can be effected by dry blending the partially saponified PVA and a carboxylic acid anhydride in a ribbon blender, a Henschel mixer, a twin-cylinder mixer, etc. and melt-kneading the mixture by means of a Banbury mixer, a mixing roll, a single- or twin-screw extruder, a kneader, etc. The reaction may also be conducted in an autoclave, where the reactants are dissolved in a solvent under heating. In particular, the method of melt-kneading by the use of a single- or twin-screw extruder having a sufficient kneading force completes the reaction in a reduced time to decrease the production cost because no solvent is necessary (solvent removal or drying of the polymer is no more required) and also the reaction temperature can be set higher than in a solution reaction.

In a conventional solution reaction, since the solvent used adversely influences the reactivity between partially saponified PVA and a carboxylic acid anhydride, it is difficult to control the degree of modification with carboxylic acid. Besides, a large quantity of a carboxylic acid anhydride is needed to accomplish modification to a prescribed degree. To the contrary, since in a molten state the reaction rate becomes extremely high, a prescribed degree of modification can be reached by addition of a reduced amount of a carboxylic acid anhydride.

Modified PVA (A-1) is preferably formulated into a photosensitive resin composition having the following composition:

| (A-1) | Modified PVA (A-1) | 100 parts by weight |
|---|---|---|
| (B) | Unsaturated epoxy resin | 0.1 to 10 parts by weight |
| (C) | Polymerizable unsaturated compound having ethylenical double bond per molecule | 20 to 200 parts by weight |
| (D) | Photopolymerization initiator | 0.1 to 10 parts by weight |

Modified PVA (A-2) can arbitrarily be formulated into a photosensitive resin composition. In particular, the following composition is preferred:

(A-2) Modified PVA (A-2)

(C) Polymerizable unsaturated compound having an ethylenical double bond per molecule (D) Photopolymerization initiator The following composition is still preferred:

| (A-2) | Modified PVA (A-2) | 100 parts by weight |
|---|---|---|
| (B) | Unsaturated epoxy compound | 0.1 to 10 parts by weight |
| (C) | Polymerizable unsaturated compound having ethylenical double bond per molecule | 20 to 200 parts by weight |
| (D) | Photopolymerization initiator | 0.1 to 10 parts |

The unsaturated epoxy compound which can be used as component (B) is a compound having at least one epoxy group and at least one ethylenically unsaturated group per molecule. The ethylenically unsaturated group preferably includes an acryloyl group and a methacryloyl group. The unsaturated epoxy compound reacts with the carboxyl group on the side chain of the modified PVA to introduce an unsaturated bond into the modified PVA. The introduced unsaturated bond is effective to reinforce the crosslinked structure of the photosensitive resin composition. Suitable unsaturated epoxy compounds (B) include glycidyl acrylate, glycidyl methacrylate, 3,4-epoxycyclohexyl acrylate, and 3,4- epoxycyclohexyl methacrylate. Unsaturated epoxy compounds obtained by addition reaction of an unsaturated compound having at least one active hydrogen atom per molecule and a compound having at least two epoxy groups per molecule are also useful. These epoxy compounds may be used either individually or as a combination of two or more thereof.

Unsaturated epoxy compound (B) is preferably used in an amount of from 0.1 to 10 parts by weight per 100 parts by weight of modified PVA (A-1) or (A-2). If the proportion of unsaturated epoxy compound (B) is less than 0.1 part by weight, sufficient improvement in photo-crosslinking properties cannot be obtained. If it exceeds 10 parts by weight, developability after exposure to light is reduced.

The polymerizable unsaturated compound having an ethylenical double bond per molecule which can be used as component (C) is not particularly limited as long as the ethylenical double bond in the molecule is polymerizable. Suitable polymerizable unsaturated compounds (C) include compounds having an acryloyl group, a methacryloyl group, an acrylamido group, a methacrylamido group, a maleic diester group, an allyl group, a vinyl ether group, a vinyl thio-ether group, or a vinylamino group. Those having an acryloyl group, a methacryloyl group, an acrylamido group or a methacrylamido group are preferred. Those having an acryloyl group, a methacryloyl group, an acrylamido group or a methacrylamido group as an unsaturated group and a hydroxyl group per molecule are especially preferred. Note that compounds included in the category of unsaturated epoxy compound (B) are excluded from component (C).

Specific examples of suitable polymerizable unsaturated compounds (C) are monofunctional monomers, such as acrylic acid, methacrylic acid, methyl acrylate, methyl methacrylate, butyl acrylate, cyclohexyl acrylate, dimethylaminoethyl methacrylate, benzyl acrylate, carbitol acrylate, 2-ethylhexyl acrylate, 2-ethylhexyl methacrylate, lauryl methacrylate, 2-hydroxyethyl acrylate, 2-hydroxyethyl methacrylate, 2-hydroxypropyl acrylate, 2-hydroxypropyl methacrylate, 2-hydroxybutyl acrylate, 2-hydroxybutyl methacrylate, 3-chloro-2-hydroxypropyl acrylate, 3-chloro-2-hydroxypropyl methacrylate, acrylamide, methacrylamide, N-methylolacrylamide, N-diacetonacrylamide, N,N'-methylenebisacrylamide, styrene, acrylonitrile, vinyl acetate, and N-vinylpyrrolidone; polyfunctional acrylic monomers or oligomers, such as ethylene glycol diacrylate, diethylene glycol diacrylate, triethylene glycol diacrylate, polyethylene glycol diacrylate, polyethylene glycol dimethacrylate, propylene glycol diacrylates, propylene glycol dimethacrylate, polypropylene glycol diacrylate, polypropylene glycol dimethacrylate, butylene glycol diacrylate, butylene glycol dimethacrylate, polybutylene glycol diacrylate, polybutylene glycol dimethacrylate, neopentyl glycol diacrylate, neopentyl glycol dimethacrylate, 1,4-butanediol diacrylate, 1,4-butanediol dimethacrylate, 1,6-hexanediol diacrylate, 1,6-hexanediol dimethacrylate, pentaerythritol diacrylate, pentaerythritol dimethacrylate, pentaerythritol triacryalte, trimethylolpropane triacrylate, trimethylolpropane trimethacrylate, and tetramethylolmethane tetraacrylate; and polycarboxylic acid unsaturated esters, such as diallyl phthalate, diallyl isophthalate, diallyl maleate, diallyl chlorendate, diallyl adipate, diallyl diglycolate, triallyl cyanurate, and diethylene glycol bisallylcarbonate. These unsaturated compounds may be used either individually or as a combination of two or more thereof.

Polymerizable unsaturated compound (C) is preferably used in an amount of 20 to 200 parts by weight, still preferably 50 to 150 parts by weight, per 100 parts by weight of modified PVA (A-1) or (A-2). If the amount of component (C) is less than 20 parts by weight, the crosslinking density of the relief is not enough for obtaining sufficient image reproduction. If it exceeds 200 parts by weight, the crosslinking density of the relief becomes too high for toughness.

The photopolymerization initiator which can be used as component (D) is arbitrarily selected as far as it is capable of absorbing light to cause component (C) to polymerize. Photopolymerization initiators having radical initiation performance are usually used. Suitable radical initiators include carbonyl compounds, azo compounds, organic sulfur compounds, halogen compounds, photosensitive dyes, organometallic compounds, and metallic carbonyl compounds, with carbonyl compounds, azo compounds, organic sulfur compounds, and halogen compounds being preferred. Carbonyl compounds and azo compounds are particularly preferred.

Specific examples of useful photopolymerization initiators are benzophenone, Michler's ketone, xanthone, thioxanthone, 2-chlorothioxanthone, 2-ethylanthraquinone, acetophenone, trichloroacetophenone, 2-hydroxy-2-methylpropiophenone, 2-hydroxy-2-methyl-4'-isopropylpropiophenone, 1-hydroxycyclohexyl phenyl ketone, benzoin methyl ether, benzoin ethyl ether, benzoin propyl ether, benzoin butyl ether, benzoin isopropyl ether, benzoin isobutyl ether, 2,2-diethoxyacetophenone, benzyl dimethyl ketal, benzil, methylbenzoyl formate, azobisisobutyronitrile, 2-o-chlorophenyl-4,5-bis(m-methoxyphenyl)imidazolyl dimer, 2-mercaptobenzothiazole, 7-diethylamino-4-methylcoumarin, mercury bromide, carbon tetrachloride, riboflavin, carbonyl manganese, triphenylphosphine, and zinc oxide.

Photopolymerization initiator (D) is preferably used in an amount of 0.01 to 10 parts by weight, still preferably 0.05 to 5 parts by weight, per 100 parts by weight of modified PVA (A-1) or (A-2). If the amount of photopolymerization initiator (D) is less than 0.01 part, photopolymerization reaction does not take place sufficiently, failing to obtain satisfactory image reproduction. If it exceeds 10 parts by weight, heat stability and preservation stability of the composition are considerably impaired.

It is effective to add a polyhydric alcohol as a compatibilizer between modified PVA (A-1) or (A-2) and components (B) and (C). A preferred amount of the polyhydric alcohol to be added ranges from 0 up to 30% by weight, still preferably from 1 to 30% by weight, based on the photosensitive resin composition. Examples of suitable polyhydric alcohols are ethylene glycol, diethylene glycol, triethylene glycol, glycerin, trimethylolpropane, and trimethylolethane.

The photosensitive resin composition of the present invention may also contain 0.001 to 5% by weight of a radical polymerization inhibitor as a heat stabilizer. Phenols, hydroquinones, and catechols are preferred polymerization inhibitors.

If desired, the photosensitive resin composition of the present invention may contain other additives, such as dyes, pigments, surface active agents, defoaming agents, ultraviolet absorbents, and flavors, as far as the functions of the composition are not impaired.

The method for preparing the photosensitive resin composition of the present invention is not particularly restricted as long as the functions of the composition are not impaired. In general, the photosensitive resin composition of the present invention can be prepared first by preparing modified PVA and then mixing the resulting modified PVA with components (C), (D) and, if desired, (B). In one of preferred embodiments, modified PVA (A-1) or (A-2) is dissolved in a solvent, for example, a mixed solvent of water and an alcohol while heating. If desired, unsaturated epoxy compound (B) is added to the solution to conduct the reaction therebetween. Then, photopolymerizable unsaturated compound (C) and photopolymerization initiator (D) are added thereto, followed by mixing by thoroughly stirring to obtain a solution of the photosensitive resin composition. The composition can also be prepared by directly melt-kneading the components in an extruder, etc.

A PS plate having a photosensitive layer made of the photosensitive resin composition of the present invention can be produced by a method of extruding the resin composition in a molten state on a substrate, a method of preparing a photosensitive sheet by dry film formation and bonding the sheet on a substrate, or a method of film casting the solution of the resin composition on a substrate. A photosensitive layer preferably has a thickness of 0.01 to 10 mm.

The substrate to be used in a PS plate is not particularly limited as long as it possesses characteristics as a printing material and can support the photosensitive layer. In general, a sheet or plate of a metal, e.g., steel, stainless steel, aluminum or copper; plastic, e.g., polyethylene terephthalate, polypropylene, polyamide, polybutylene terephthalate or polysulfone; or synthetic rubber, e.g., a styrene/butadiene copolymer, is used as a substrate.

A relief image for printing is formed by contacting a negative or positive original film on the thus formed photosensitive layer, exposing the photosensitive layer through the film to ultraviolet light having a chief wavelength range of 300 to 400 μm to induce polymerization of the photosensitive resin composition to insolubilize the photosensitive layer. Then the unpolymerized areas are dissolved in water by means of a spray developing machine or a brush developing machine using neutral water to leave a relief image on the substrate.

The photosensitive resin composition having the foregoing constitution provides a presensitized printing material exhibiting high sensitivity, highly precise image reproducibility, and satisfactory water developability to provide a printing plate whose relief has excellent toughness. The resin composition of the present invention is particularly suitable as a relief printing material and is also useful as a lithographic printing material, intaglio printing material, stencil printing material or a photoresist.

The present invention will now be illustrated in greater detail with reference to Examples, but it should be understood that the present invention is not construed as being limited thereto. Unless otherwise indicated, all the parts and ratios are by weight.

EXAMPLE 1

1) Synthesis of Modified PVA:

Partially saponified PVA derived from polyvinyl acetate and having a number average degree of polymerization of 500 and a degree of saponification of 80 mol % was dry blended with 4% by weight of succinic anhydride. The mixture was melt-kneaded in a single-screw extruder set at 210° C., cooled on a cooling belt, and pelletized with a cutter to obtain pale yellow transparent pellets of modified PVA. Reprecipitation in water/ethanol gave purified modified PVA having a carboxyl equivalent of 0.373 mol/kg (acid value: 20.9).

2) Preparation of PS Plate:

In 200 parts of a 30/70 mixed solvent of ethanol/water was dissolved 100 parts of the modified PVA obtained above by heating at 70° C. over 3 hours. Five parts of glycidyl acrylate were added to the solution, followed by stirring for 30 minutes to introduce an unsaturated bond to the modified PVA. To the mixture were added 35 parts of an addition product of 1 mol of propylene glycol diglycidyl ether and 2 mol of acrylic acid, 35 parts of 2-hydroxyethyl acrylate, 3 parts of dimethyl benzyl ketal as a photopolymerization initiator, 10 parts of diethylene glycol, and 0.1 part of hydroquinone monomethyl ether, and the mixture was stirred for 30 minutes to prepare a solution of a photosensitive resin composition.

The resulting resin solution was cast on a 200 µm thick polyethylene terephthalate film on which an unsaturated polyester-based adhesive had previously been applied, and dried in a hot-air oven at 60° C. for 5 hours to obtain a 950 µm thick laminate sheet. A 50/50 mixed solvent of ethanol/water was applied to the surface of the laminate sheet, and a 100 µm thick polyethylene terephthalate film having been matted by chemical etching was adhered thereon as a cover film. The thus prepared PS plate with a cover film was stored in a dark place for 10 days.

3) Evaluation of Platemaking Performance:

The cover film was stripped off the PS plate. A gray scale negative film for sensitivity measurement and a negative for evaluating image reproducibility (composed of 175 lines, 3%, 5% and 10% dots, independent dots of 100 µm and 200 µm in diameter, and fine lines of 30 µm and 50 µm width) were vacuum contacted. The photosensitive layer was exposed to light through the pattern using a high-pressure mercury lamp for 1.25, 1.5, 1.75 or 2 minutes and developed with neutral water at 30° C. under a pressure of 3 kg/cm² by using a spray developing machine. The non-image areas were completely dissolved in water in 3 minutes and 50 seconds to obtain a relief image. On examining the resulting relief image, it was found that the gray scale had been reproduced up to the 18th step by 2 minutes' exposure, indicating very high sensitivity, and that the image areas showed sharp reproduction of minute images such as 3% dots, 100 µm independent dots, and 30 µm fine lines, revealing high sensitivity and high precision.

When a printing test was carried on the resulting resin printing plate, prints of sharp image with no line thickening were obtained. Even when printing was conducted continuously to obtain 300,000 copies, the relief underwent no peel or crack, lending confirmation to its toughness.

EXAMPLE 2

Carboxyl-grafted modified PVA was synthesized in the same manner as in Example 1, except for replacing 4% by weight of succinic acid with 4% by weight of maleic anhydride. The resulting carboxyl-grafted modified PVA pellets were pale yellow and transparent. After purification by reprecipitation in water/acetone, the polymer had a carboxyl equivalent of 0.38 mol/kg (acid value: 21.4).

A PS plate was prepared using the resulting modified PVA in the same manner as in Example 1, and a printing plate was produced from the PS plate in the same manner as in Example 1. The non-image areas were completely dissolved in water by 4 minutes' development to obtain a relief image which showed up to 18 steps of the gray scale in 2 minutes' exposure, proving high sensitivity of the photosensitive layer. At 2 minutes' exposure, the image areas were sharply reproduced to the level of 3% dots, 100 µm independent dots, and 30 µm fine lines, lending confirmation to high sensitivity and high precision.

On carrying out a printing test, sharp image copies with no thickening of lines were obtained. Even when printing was conducted continuously to obtain 300,000 copies, the relief underwent no peel or crack, lending confirmation to its toughness.

EXAMPLE 3

Modified PVA was synthesized in the same manner as in Example 1, except for replacing 4% by weight of succinic acid with 5% by weight of hydrogenated phthalic anhydride. The resulting modified PVA pellets were pale yellow, transparent, and amorphous. After purification by reprecipitation in water/acetone, the polymer had a carboxyl equivalent of 0.30 mol/kg (acid value: 17.0).

A PS plate was prepared using the resulting modified PVA in the same manner as in Example 1, and a printing plate was produced from the PS plate in the same manner as in Example 1. The non-image areas were completely dissolved in water by 3 minutes and 50 seconds' development to obtain a relief image which showed up to 17 steps of the gray scale, proving high sensitivity of the photosensitive layer. It was confirmed that the image areas were sharply reproduced to the level of 3% dots, 100 µm independent dots, and 30 µm fine lines.

On carrying out a printing test, sharp image prints with no thickening of lines were obtained. Even when printing was conducted continuously to obtain 300,000 copies, the relief underwent no peel or crack, lending confirmation to its toughness.

COMPARATIVE EXAMPLE 1

A hundred parts of partially saponified PVA derived from polyvinyl acetate and having a number average degree of polymerization of 500 and a degree of saponification of 80 mol % were immersed in 200 parts of N,N-dimethylformamide at 110° C. for 4 hours in an autoclave to be swollen with the solvent. To the polymer solution was added 4% by weight of succinic anhydride and allowed to react for 3 hours. The reaction solution was filtered, and the collected polymer was dried in hot air at 70° C. for 8 hours to recover the polymer as pale yellow powder. The resulting polymer caked on addition of water and was hard to dissolve. The carboxyl equivalent was 0.17 mol/kg (acid value: 9.7) after reprecipitation in water/acetone.

A PS plate was prepared in the same manner as in Example 1, but since the polymer was not dissolved by heating at 70° C. for 3 hours, it was further heated at 80° C. for an additional period of 2 hours.

The resulting PS plate was exposed and developed in the same manner as in Example 1 to obtain a printing plate. The non-image areas were completely dissolved in water by 4 minutes' development to obtain a relief image. The examination of the relief revealed reproduction of the gray scale only up to the 16th step, revealing low sensitivity of the PS plate. In the image areas, a half of the 3% dots were not reproduced, the 100 μm independent dots fell, and the 30 μm lines were seriously distorted.

That is, since the modified PVA had al small carboxyl equivalent, the PS plate prepared by using it had low sensitivity and poor image reproducibility. Preparation of a solution of the photosensitive resin composition was difficult due to the low solvent solubility of the modified PVA.

COMPARATIVE EXAMPLE 2

Partially saponified PVA obtained from polyvinyl acetate and having a number average degree of polymerization of 650 and a degree of saponification of 80 mol % was swollen in N,N-dimethylformamide by heating at 110° C. To the polymer solution was added 8% by weight of phthalic anhydride to introduce a carboxyl group to the polymer side chain. The polymer was dried in a hot air drier to reduce the N,N-dimethylformamide content to 1% by weight or less to obtain a powdered polymer. The resulting polymer had a carboxyl equivalent of 0.27 mol/kg (acid value: 15).

A PS plate was prepared in the same manner as in Example 1, but since the polymer was not dissolved by heating at 70° C. for 3 hours, it was further heated at 80° C. for an additional period of 2 hours.

The resulting PS plate was exposed and developed in the same manner as in Example 1 to obtain a printing plate. The non-image areas were completely dissolved in water by 4 minutes' development to obtain a relief image. The examination of the relief revealed reproduction of the gray scale only up to the 16th step, indicating lower sensitivity than in Example 1. In the image areas, 10% of the 3% dots were not reproduced, the 100 μm independent dots fell, and the 30 μm lines were seriously distorted. Additionally, it was difficult to prepare a solution of the photosensitive resin composition due to the low solvent solubility of the modified PVA.

COMPARATIVE EXAMPLE 3

A PS plate was prepared in the same manner as in Example 1 except for using unmodified PVA having a number average degree of polymerization of 500 and a degree of saponification of 80 mol %.

The PS plate was exposed and developed in the same manner as in Example 1 to obtain a printing plate. The non-image areas were completely dissolved in water by 4 minutes' development to obtain a relief image. The examination of the relief revealed reproduction of the gray scale only up to the 15th step, proving lower sensitivity of the PS plate than in Example 1. In the image areas, only about a half of the 3% dots were reproduced, the 100 μindependent dots were not reproduced, and the 30 μlines suffered from cutting in parts, lifting, and remarkable distortion. Compared with the foregoing Examples, it is seen that the PS plate obtained from the above photosensitive resin composition has low sensitivity and low image reproducibility.

While the invention has been described in detail and with reference to specific examples thereof, it will be apparent to one skilled in the art that various changes and modifications can be made therein without departing from the spirit and scope thereof.

What is claimed is:

1. A process for producing a photopolymerizable resin composition comprising reacting partially saponified polyvinyl alcohol having a degree of saponification of 60 to 99 mol % and a number average degree of polymerization of 300 to 2,000 with 0.001–20 parts by weight of a carboxylic acid anhydride in a molten state to prepare modified polyvinyl alcohol and mixing (A) 100 parts by weight of said modified polyvinyl alcohol with (B) from 0.1 to 10 parts by weight of an unsaturated epoxy compound, (C) from 20 to 200 parts by weight of a polymerizable unsaturated compound having an ethylenic double bond in the molecule thereof, and (D) from 0.1 to 10 parts by weight of a photopolymerization initiator.

* * * * *